United States Patent
Clairet et al.

(10) Patent No.: US 9,609,693 B2
(45) Date of Patent: Mar. 28, 2017

(54) HEATING SYSTEM AND METHOD OF TESTING A SEMICONDUCTOR DEVICE USING A HEATING SYSTEM

(75) Inventors: Maxime Clairet, Labastidette (FR); Carlos Pereira, Plaisance du Touch (FR)

(73) Assignee: NXP USA, Inc., Austin, TX (US)

( * ) Notice: Subject to any disclaimer, the term of this patent is extended or adjusted under 35 U.S.C. 154(b) by 158 days.

(21) Appl. No.: 14/394,788

(22) PCT Filed: Apr. 26, 2012

(86) PCT No.: PCT/IB2012/001186
§ 371 (c)(1),
(2), (4) Date: Oct. 16, 2014

(87) PCT Pub. No.: WO2013/160716
PCT Pub. Date: Oct. 31, 2013

(65) Prior Publication Data
US 2015/0084657 A1    Mar. 26, 2015

(51) Int. Cl.
*G01R 31/00*    (2006.01)
*H05B 3/06*    (2006.01)
(Continued)

(52) U.S. Cl.
CPC ........... *H05B 3/06* (2013.01); *G01R 31/2601* (2013.01); *G01R 31/2642* (2013.01); *G01R 31/2875* (2013.01); *F24H 9/2071* (2013.01)

(58) Field of Classification Search
CPC ........... G01R 31/2874; G01R 31/2886; G01R 31/2891; G01R 31/2867
(Continued)

(56) References Cited

U.S. PATENT DOCUMENTS 5,105,067 A * 4/1992 Brekkestran ....... G05D 23/2401
                                                    2/69
5,158,132 A * 10/1992 Guillemot ............... B29C 33/02
                                                    100/320
(Continued)

FOREIGN PATENT DOCUMENTS

JP    2008-122189 A    5/2008
WO    2010-093517 A2    8/2010

OTHER PUBLICATIONS

International Search Report and Written Opinion correlating to PCT/IB2012/001186 dated Jan. 21, 2013.
(Continued)

*Primary Examiner* — Tung X Nguyen
*Assistant Examiner* — Dominic Hawkins
(74) *Attorney, Agent, or Firm* — Charlene R. Jacobsen (57) ABSTRACT

A heating system is described for generating heat and bringing heat to a semiconductor device under test. The heating system comprises a conduction heating unit comprising a heating resistor, a thermal contact area for thermally contacting the semiconductor device under test, and a thermally conductive and electrically insulating connection between the heating resistor and the thermal contact area. The heating resistor is operable to generate a user-defined amount of heat and arranged to provide a part of the heat generated by the heating resistor to the thermal contact area via the thermally conductive and electrically insulating connection. It is also described that the heating system may further comprise a convection heating chamber operable to provide a user-defined heat-controlled convection to the semiconductor device under test. A method of testing a semiconductor device using a heating system is also described.

13 Claims, 6 Drawing Sheets

(51) Int. Cl.
  *G01R 31/28* (2006.01)
  *G01R 31/26* (2014.01)
  *F24H 9/20* (2006.01)

(58) Field of Classification Search
  USPC .......................... 324/750.03, 750.04, 750.06
  See application file for complete search history.

(56) References Cited

U.S. PATENT DOCUMENTS

| | | | | |
|---|---|---|---|---|
| 5,192,853 A * | 3/1993 | Yeh | ................ | H05B 3/141 219/505 |
| 6,543,282 B1 * | 4/2003 | Thompson | .............. | G01F 1/696 73/204.15 |
| 2002/0092349 A1 * | 7/2002 | Watanabe | ............. | G01F 1/6845 73/204.22 |
| 2002/0118032 A1 * | 8/2002 | Norris | ................ | G01R 31/2877 324/750.07 |
| 2003/0197524 A1 | 10/2003 | Ito et al. | | |
| 2004/0012400 A1 * | 1/2004 | Sauk | ................. | G01R 31/2886 324/754.03 |
| 2006/0066335 A1 * | 3/2006 | Kang | ................. | G01R 31/2877 324/750.11 |
| 2006/0097740 A1 * | 5/2006 | Howland, Jr. | ....... | G01R 31/312 324/750.03 |
| 2009/0003410 A1 * | 1/2009 | Eng, Jr. | ................ | G01R 15/125 374/185 |
| 2010/0230804 A1 * | 9/2010 | Kise | ........................ | H01L 23/10 257/712 |
| 2011/0080677 A1 * | 4/2011 | Radosavljevic | ....... | H01H 71/20 361/42 |
| 2011/0176280 A1 * | 7/2011 | Lee | ......................... | H01L 25/16 361/721 |
| 2013/0049781 A1 * | 2/2013 | Ko | ......................... | H01L 23/345 324/750.11 |
| 2014/0253157 A1 * | 9/2014 | Dean | ....................... | G01R 1/44 324/750.09 |

OTHER PUBLICATIONS

OARS1, OARS3: OARS 1, 3, and XP—Application Note, IRC, TT Electronics, Mar. 2010, pp. 1-3.
SilPad 400: The Bergquist Company, PD S_SP_400_12.08, p. 1.

* cited by examiner

HEATING SYSTEM AND METHOD OF TESTING A SEMICONDUCTOR DEVICE USING A HEATING SYSTEM

FIELD OF THE INVENTION

This invention relates to a heating system and method of testing a semiconductor device using a heating system.

BACKGROUND OF THE INVENTION

Qualification of semiconductor devices usually involves a plurality of tests, including tests at elevated temperatures. Such tests are referred to with different names, such as High Temperature Operating Life Test (HTOL), reliability test and stress test. Without limiting us to a specific type of test, we will briefly refer to any of these tests as HTOL tests. The test conditions may depend on the specific semiconductor device and its intended application. The common method to test semiconductor devices during prolonged operation at an elevated temperature is to operate the semiconductor device under test in a convection heating chamber, such as an oven, that is operated during the test to provide a user-defined heat-controlled convection to the semiconductor device under test (briefly referred to as DUT). Such known method may however have disadvantages. For example, a HTOL test may require using temperatures higher than the maximum temperature of the available oven, e.g. requiring testing at 150° C. while the available oven is only able to provide 135° C., thus needing to acquire a new oven. As another example, another HTOL test may require testing at a plurality of temperatures, e.g. at 135° C. and 150° C. As another example, another HTOL test may require testing at a one or more temperatures relatively little above typical ambient temperatures, such as e.g. in a range of 25° C.-50° C.

Figure 1:
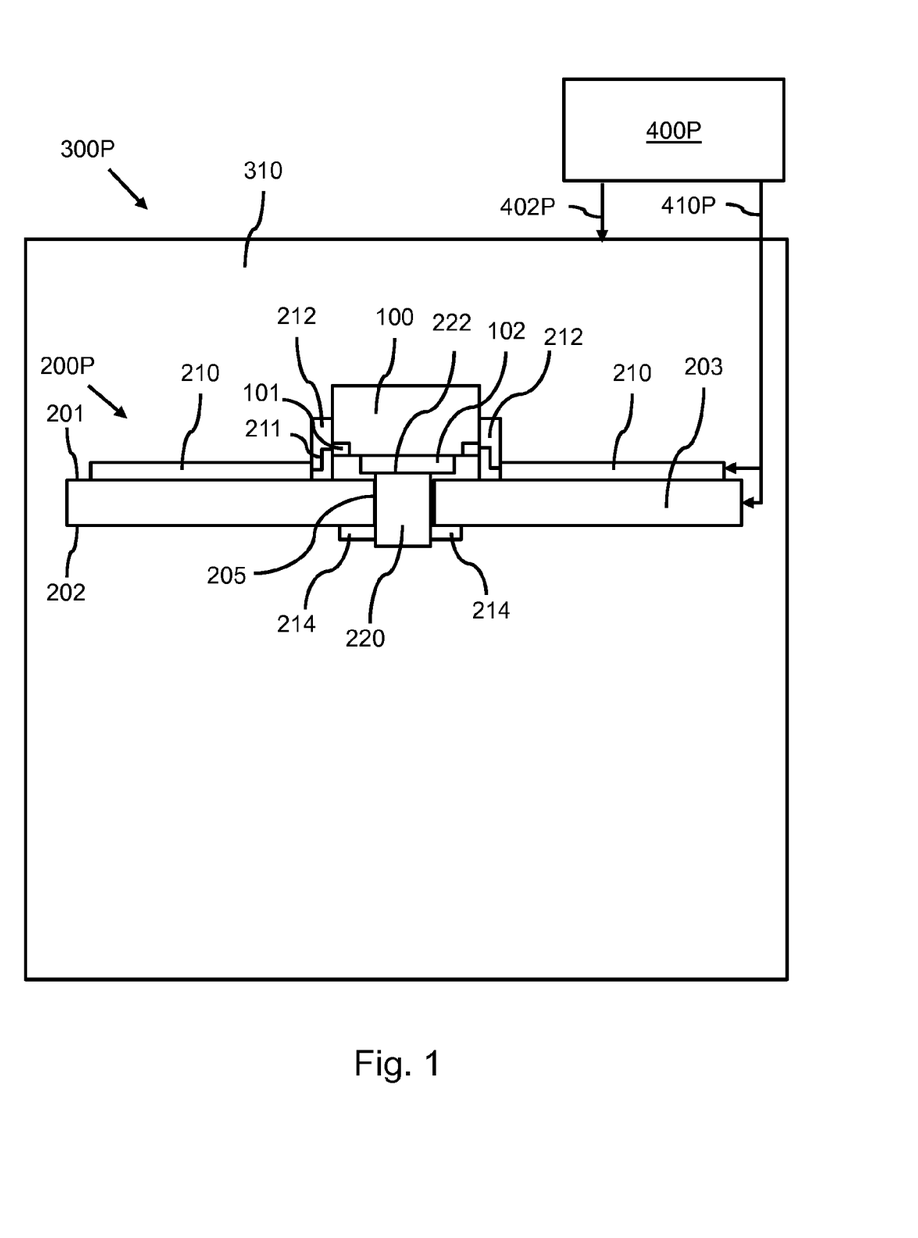
FIG. 1 schematically shows an example of a prior art heating system wherein an HTOL test is performed on a semiconductor device under test.

FIG. 1 schematically shows an example of a prior art heating system 300P. FIG. 1 shows the prior art heating system while an HTOL test is performed on a semiconductor device under test 100. The heating system 300P comprises an oven having a convection heating chamber 310. The convection heating chamber 310 is operable to provide a user-defined heat-controlled convection to the semiconductor device under test 100 (DUT) placed in the convection heating chamber 310.

The user-defined heat-controlled convection corresponds to an oven air flow heating the semiconductor device under test 100. Hereby, the semiconductor device under test 100 may be tested while being operated in an environment of a pre-determined temperature, e.g. at 135° C.

The semiconductor device under test 100 is temporary received in a socket 212 on a test board 200P. The socket 212 comprises electrical connections 211 connecting signal pins 101 of the semiconductor device under test 100 via a signal conductor 210 provided on a top side 201 of the test board 200P to a control system 400P. A contact area 222 is provided in the socket 212. The contact area 222 contacts an expose pad 102 of the semiconductor device under test 100 when the semiconductor device under test 100 is received in the socket 212. A pin 220 extends through a through-hole 205 extending through body 203 of the test board 200P to a supply line 214 provided on a bottom side 202 of the test board 200P. The supply line 214 is connected to a supply voltage.

The control system 400P provides when in operation control signals 410P via the signal conductor 210 to the signal pins 101 of the semiconductor device under test 100 and for operating the semiconductor device under test 100 with electrical operating conditions. The control system 400P further controls the supply voltage provided to the expose pad 102 of the semiconductor device under test 100 via the supply line 214 and the pin 220 contacting the expose pad 102.

The control system 400P further controls the convection heating chamber 310 via a convection control signal 402P to provide a user-defined heat-controlled convection to the semiconductor device under test 100. Alternatively, the convection heating chamber 310 is controlled independently to provide the user defined heat controlled convection.

A user may thus perform a High Temperature Operating Life Test (HTOL) on the semiconductor device under test 100 at a temperature defined by user-defined heat-controlled convection by operating the semiconductor device under test 100 for a prolonged period at the temperature defined by user-defined heat-controlled convection.

SUMMARY OF THE INVENTION

The present invention provides a heating system and method of testing a semiconductor device using a heating system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Although FIG. 1 shows a single semiconductor device under test 100, it will be understood that the test board 200P usually has a plurality of sockets 212 receiving a plurality of semiconductor devices under test 100, allowing to test multiple semiconductor devices simultaneously at the same temperature.

Figure 2:
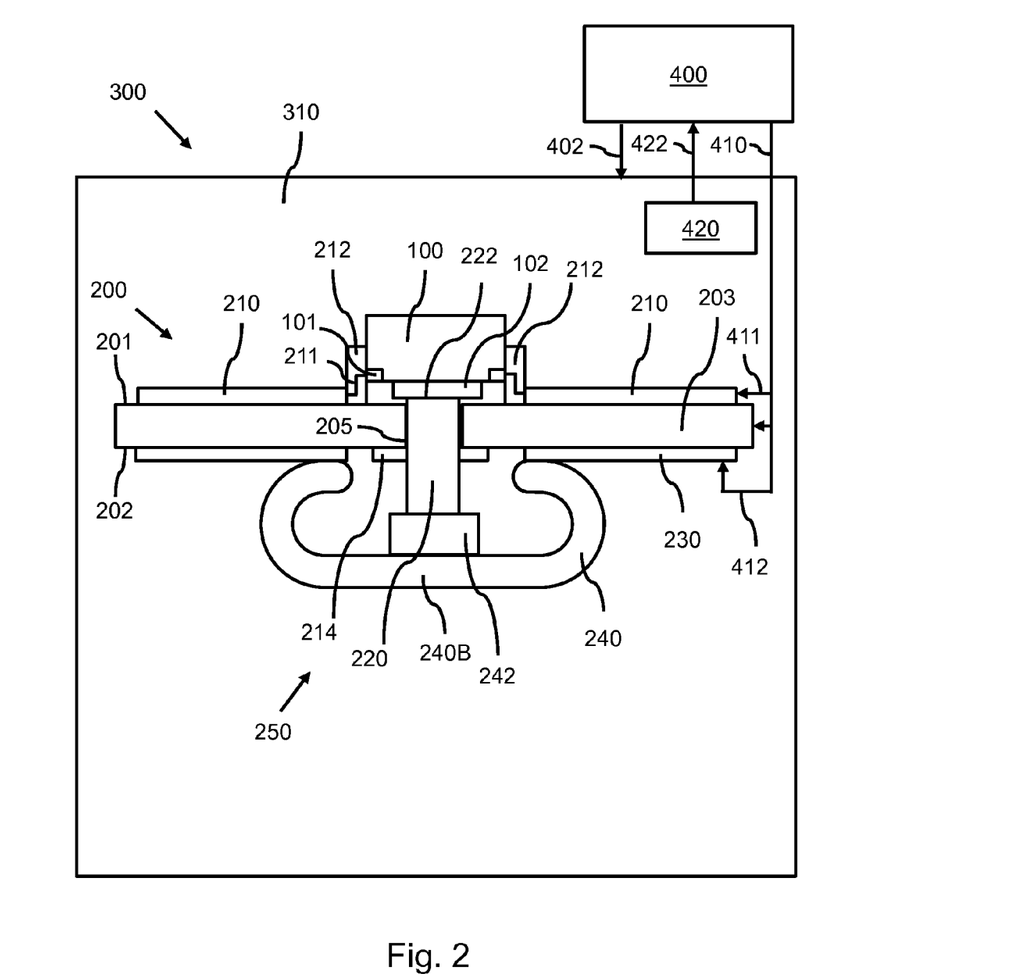
FIG. 2 schematically shows an example of an embodiment of a heating system wherein an HTOL test is performed on a semiconductor device under test.

FIG. 2 schematically shows an example of a heating system 300. FIG. 2 shows the heating system while an HTOL test is performed on a semiconductor device under test 100. The semiconductor device under test 100 is temporary received in a socket 212 on a test board 200, in a similar manner as the semiconductor device under test 100 was received in the prior art heating system as described with reference to FIG. 1. The heating system 300 comprises a similar convection heating chamber 310 as the prior art heating system described with reference to FIG. 1. Further components of the heating system 300, the test board 200, the semiconductor device under test 100, the control system 400, control signals 410 and convection control signal 402 are numbered with corresponding reference numerals as corresponding components of the heating system 300P, the test board 200P, the semiconductor device under test 100, the control system 400P and control signals 410P and convection control signal 402P in FIG. 1.

The heating system 300 further comprises a conduction heating unit 250. The conduction heating unit 250 comprises a heating resistor 240, a thermal contact area 222 for thermally contacting the semiconductor device under test 100, and a thermally conductive and electrically insulating connection 220, 242 between the heating resistor 240 and the thermal contact area 222.

The heating resistor 240 is operable to generate a user-defined amount of heat and is arranged to provide a part of the heat generated by the heating resistor 240 to the thermal contact area 222 via the thermally conductive and electrically insulating connection 220, 242. Such heating system may allow heating a semiconductor device under test in a convenient manner. The conduction heating unit comprises a socket 222 for temporary receiving the semiconductor device under test 100. The socket 212 comprises an electrical connection 211 for connecting the semiconductor device under test 100 via a signal conductor 210 to an electrical system for operating the semiconductor device under test with electrical operating conditions. The thermal contact area 222 is arranged in the socket 212 for connecting the semiconductor device under test 100, when received in the socket 212, via the thermally conductive and electrically insulating connection 220, 242 to the heating resistor 240. The heating resistor 240 is connected to a resistor supply conductor 230 provided at the bottom side 202 of the test board 200. When the heating resistor 240 is supplied with a resistor supply current via the resistor supply conductor 230, the heating resistor 240 will generate an amount of heat in dependence on the resistor supply current. The amount of heat as a function of resistor supply current may have been determined using a calibration procedure, or be measured during use. The control system 400 controls the resistor supply current using a resistor control signal 412 to generate a user-defined amount of heat.

The thermal contact area 222 contacts an expose pad 102 of the semiconductor device under test 100 when the semiconductor device under test 100 is received in the socket 212, hereby making thermal and electrical contact. Similarly as shown in FIG. 1, a pin 220 extends through a through-hole 205 extending through the test board 200 to a supply line 214 provided on a bottom side 202 of the test board 200. The pin 220 makes electrical contact to the supply line 214.

The pin 220 further makes thermal contact to the heating resistor 240 via an insulating layer 242. Hereby, a thermally conductive and electrically insulating connection is formed between the heating resistor 240 and the thermal contact area 222, and thus between the heating resistor 240 and the semiconductor device under test 100. The insulating layer 242 may e.g. be a pad consisting of a silicone material, or a pad comprising a silicone material and another material. An example is e.g. a Sil-Pad 400, e.g. the SP400-0.007-AC-1212, as commercially available from The Bergquist Company (www.bergquistcompany.com), which is a composite of silicone rubber and fiberglass and being offered commercially with a primary use to electrically isolate power sources from heat sinks. Other suitable examples may be a Kapton polyimide film or a Teflon thermoplastic film.

The heating system 300 thus comprises a heating chamber 310 operable to provide a user-defined heat-controlled convection to the semiconductor device under test 100. Such heating allows providing heat to the semiconductor device by conduction as well as convention, whereby a larger temperature range may be provided by the heating system, such as a range of 25-200° C., and/or a more flexible operation at different temperatures may be achieved. Such heating system may be relatively cheap compared to a heating system with a convection heating chamber capable to provide an increased temperature.

The heating system 300 also has a conduction heating unit 250 operable to provide a part of the heat generated by the heating resistor 240 to the semiconductor device 100 via its exposed pad 102 in contact with the thermal contact area 222 via the thermally conductive and electrically insulating connection provided by the pin 220 and the insulating layer 242. Although FIG. 2 shows a only a single heating resistor 240 in contact with a single semiconductor device under test 100, it will be understood that the test board 200 may have a plurality of heating resistors 240 in contact with a plurality of semiconductor devices under test 100 via respective thermally conductive and electrically insulating connections 220, 242, allowing to test multiple semiconductor devices simultaneously.

The conduction heating unit 250 is arranged to provide a pre-defined part of the heat generated by the heating resistor 250 to the thermal contact area 222. The pre-defined part may e.g. be determined by a heat-transfer calibration procedure prior to performing an HTOL test with the heating system 300. Likewise may the amount of heat as a function of resistor supply current be known from a calibration procedure.

The heating system 300 may additionally or alternatively comprise a temperature monitor 420 arranged to obtain a measure of a temperature at the thermal contact area 222. The temperature monitor 420 may be arranged to provide the measure of the temperature to the control system 400 via a monitor line 422, such that the control system 400 can control the resistor supply current to generate the user-defined amount of heat. The temperature monitor 420 and the control system 400 may thus cooperate to control the user-defined amount of heat, and by that the temperature at the thermal contact area 222, for example in a feedback manner.

The temperature monitor 420 may be arranged to obtain the measure of the temperature at the thermal contact area 222 from a measure of a temperature of the heating resistor 250, e.g. using a thermocouple thermally coupled to the heating resistor 250. Alternatively, the control system 400 can be arranged to communicate with an internal thermal sensor in the semiconductor device 100 to receive a measure of a temperature at the thermal contact area 222 from the internal thermal sensor, such that the control system 400 can control the resistor supply current. The control system 400 may e.g. communicate with the internal thermal sensor via one of the electrical connections 211.

The heating resistor 240 may e.g. be an open air resistor. Using an open air resistor may substantially prevent the test board 200 itself getting heated by the heat generated by the resistor, as the heat is generated at a distance from the test board when using such open air resistor. The term "open air resistor" may relate to a resistor formed by a metal allow strip shaped to have a bridge section 240B between the two terminals, the bridge section being designed to leave an air-gap between the bridge section and a plane defined by the solder positions of two terminals. When a current is driven though such open air resistor, heat may mainly be generated at the bridge section. Such open air resistor may have a low resistivity to minimize electrical power required to generate the heat.

The open air resistor may be formed from a flexible material to have an elastic joint between the heating resistor 240 and the pin 220 to maintain the joint also during thermal expansion of the heating resistor 240 and the pin 220. Such open air resistor may be able to sustain surface temperatures up to 250° C. or up to 300° C. at the bridge section 240B. Examples of suitable open air resistors are e.g. Open Air Resistor Surface mount resistor such as the OARS-1 and OARS-3 devices from IRC, a subsidiary of TT electronics plc (datasheet available from www.irctt.com), which allow e.g. a 1 W respectively 2 W heat generation in an operation environment of 150° C. Other examples are e.g. resistors from the OLR Series from American Accurate Components, Inc.

The conduction heating unit 250 may e.g. be capable to heat up the semiconductor device under test 100 up to 30° C. by supplying the heating resistor 240 with a resistor supply current less than 7A, such as up to 10-20° C. with a resistor supply current in a range of 0.5-3.0 A.

Figure 3:
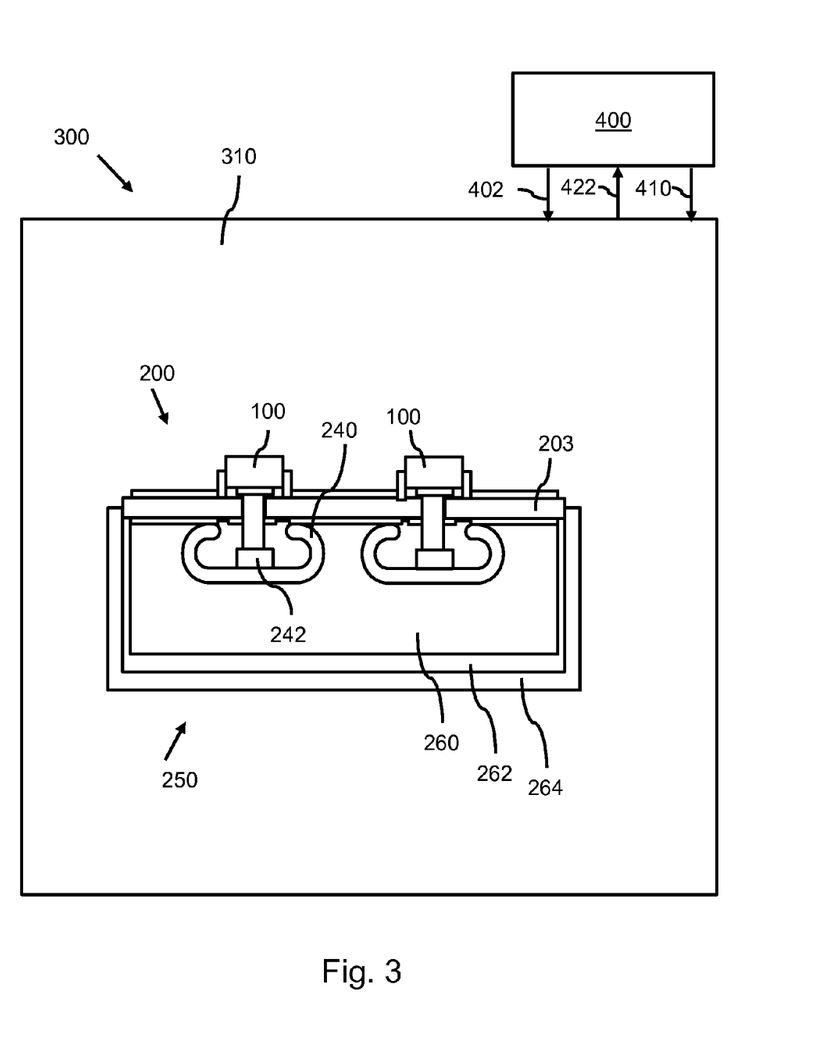
FIG. 3 schematically shows an example of an embodiment of a heating system.

FIG. 3 schematically shows an example of an embodiment of a heating system 300. FIG. 3 shows two heating resistors 240 of a plurality of heating resistors 240 in contact with two respective semiconductor devices under test 100 of a plurality of semiconductor devices under test 100 via respective thermally conductive and electrically insulating connections 220, 242. The heating system 300 shown in FIG. 3 differs from the heating system 300 shown in FIG. 2 e.g. in that the heating system 300 further comprises a thermally insulating material 262 shaped to form a thermally insulating cavity 260 at the bottom side 202 of the test board 200. The heating resistors 240 are arranged inside the thermally insulating cavity 260. The thermally insulating cavity 260 may hereby thermally isolate the heating resistors 240 from the oven air flow, thereby preventing, or at least reducing, thermal interaction between the oven air flow and the heating resistors.

The heating resistors 240 are shielded by a protective cover 264, in this example a metal plate. The protective cover 264 may hereby provide protection against mechanical damage to the heating resistors 240 and/or the thermally insulating material 262. The protective cover 264 may physically shield the heating resistors from the oven air flow and hereby prevent a direct cooling by the oven air flow of the heating resistors 240. It has been found that a combined use of the thermally insulating material 262 and the protective cover 264 may improve the heating capability of the conduction heating unit 250 with up to a further 10° C.

Figure 4:
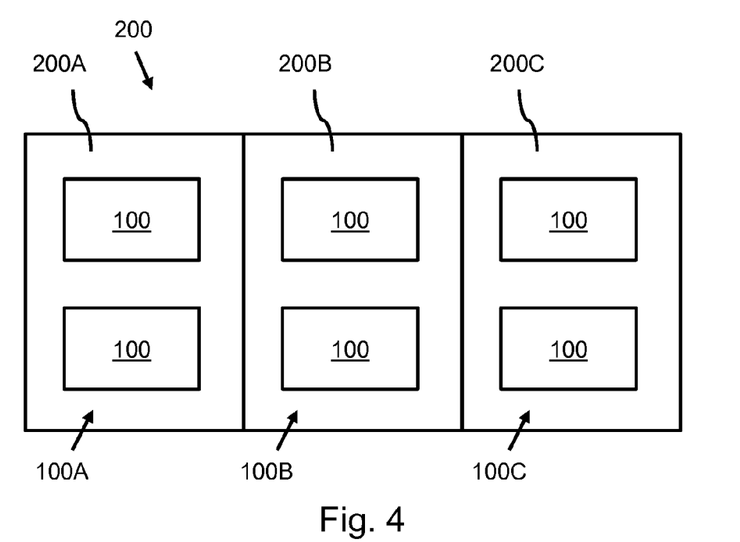
FIG. 4 schematically shows an example of an embodiment of a component of a heating system.

FIG. 4 schematically shows an example of an embodiment of a test board 200 of a heating system 300. The test board 200 allows for testing a plurality of semiconductor devices 100 and comprises a plurality of heating resistors 240, in this example one for each semiconductor device 100. The plurality of heating resistors 240 is arranged in a plurality of zones 200A, 200B, 200C on the test board 200. FIG. 4 schematically shows a plurality of in total six semiconductor devices 100 but it will be apparent that any other suitable number may be used. A first set 100A of semiconductor devices is arranged in a first zone 200A, a second set 100B of semiconductor devices is arranged in a second zone 200B and a third set 100C of two semiconductor devices is arranged in a third zone 200C. The heating resistors in the respective zones 200A, 200B, 200C are operable to generate a zone-specific user-defined amount of heat. Hereby, different amounts of heat may be simultaneously provided to the first set 100A, the second set 100B and the third set 100C of semiconductor devices 100 in respective zones 200A, 200B, 200C. Such different amounts of heat may e.g. be useful if the semiconductors devices in the different zones are all pin-compatible, but otherwise slightly different devices for applications with different temperature requirements. Such different amounts of heat may alternatively or additionally be useful if there would be a temperature gradient over the test board 100 if all heating resistors would be driven to provide the same amount of heat, as the different amounts of heat may be set to compensate for this temperature gradient.

Figure 5:
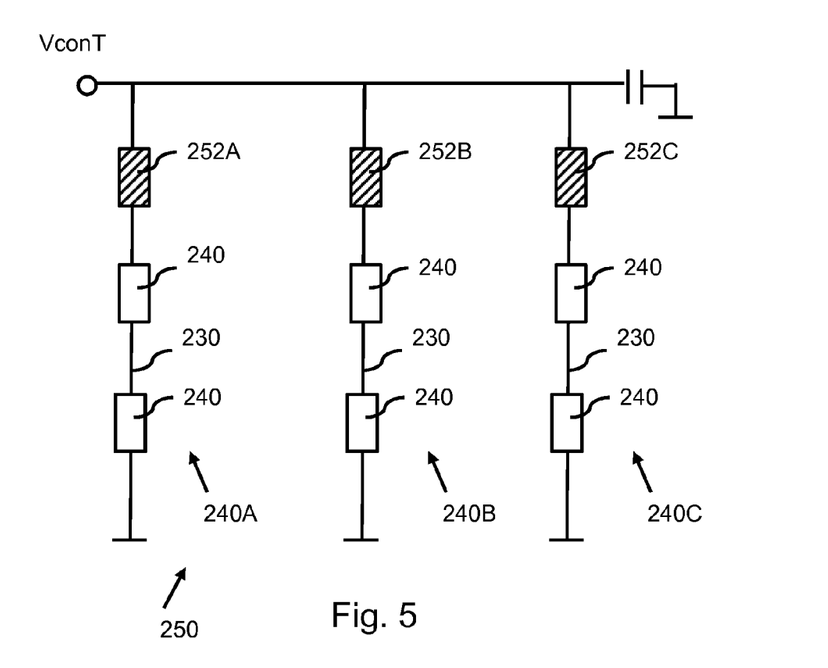
FIG. 5 and FIG. 6 schematically show examples of alternative embodiments of a component of a heating system.
Figure 6:
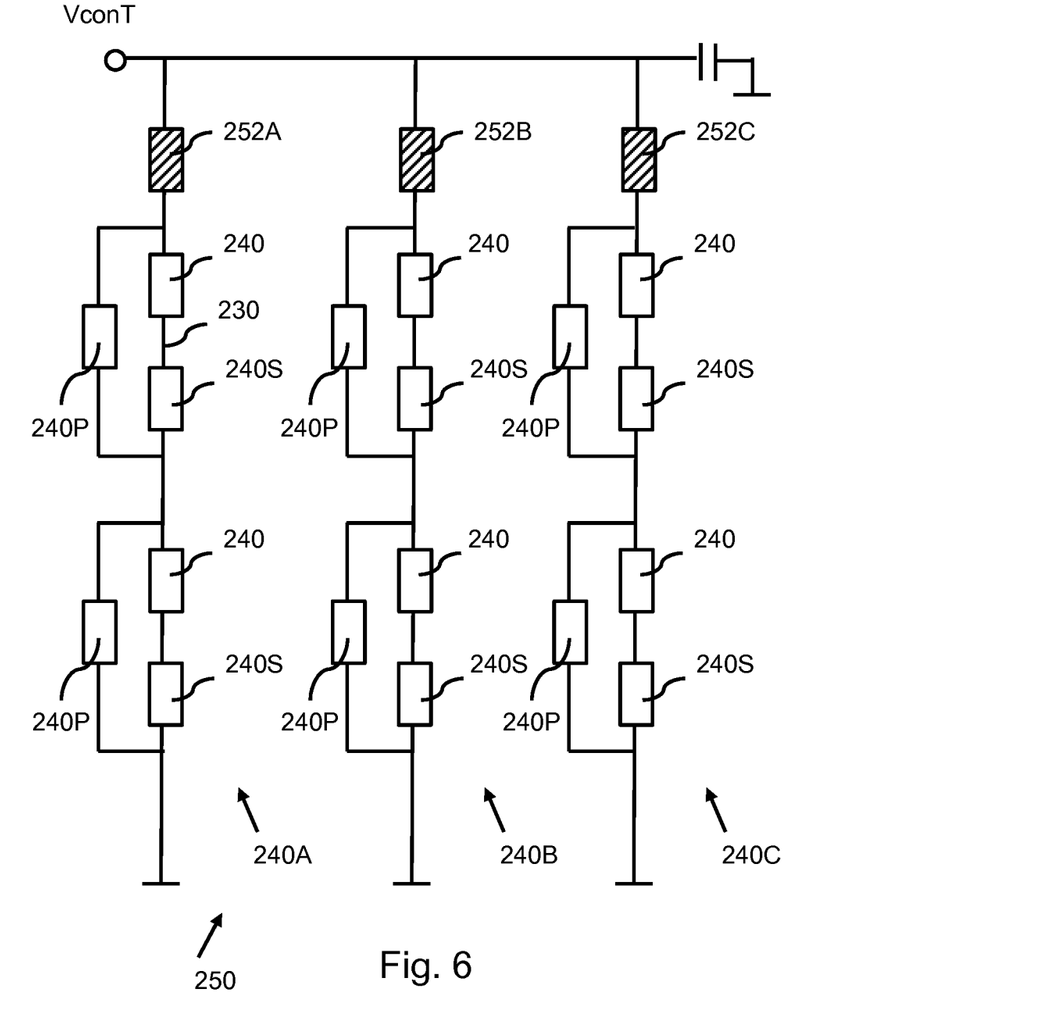

FIG. 5 and FIG. 6 schematically show examples of arrangements of heating resistors 240 of a conduction heating unit 250. The arrangements shown in FIG. 5 and FIG. 6 are examples of arrangements of the plurality of heating resistors 240 in the respective zones 200A, 200B, 200C shown in FIG. 4, whereby the heating resistors 250 in the respective zones 200A, 200B, 200C are operable to generate a zone-specific user-defined amount of heat.

FIG. 5 shows an arrangement wherein a resistor supply voltage VconT is applied to the plurality of heating resistors 240 of each of the zones 200A, 200B, 200C. The two heating resistors 240A, 240B, 240C of each of the first, second and third zone 200A, 200B, 200C are connected in series with a respective zone-specific resistor 252A, 252B, 252C between the resistor supply voltage VconT and ground. The zone-specific resistors 252A, 252B and 252C are selected per zone to provide, for each zone, the required resistor supply current through the heating resistors 240 of the zone to obtain the zone-specific user-defined amount of heat. The zone-specific resistors 252A, 252B and 252C may thus be chosen to be different if a different amount of heat is to be generated per zone. The zone-specific resistors 252A, 252B and 252C may be provided as replaceable resistors, allowing to tune the respective resistor values with little effort. The zone-specific resistors 252A, 252B, 252C may each comprise an arrangement of a plurality of resistors, e.g. with a first resistor in parallel to a series arrangement of a second and a third resistor, which may allow to define the resistivity of the arrangement with an even improved flexibility and/or accuracy. Thus, the heating resistors 240A of a first zone 200A of the plurality of zones being in electrical connection with a first tuning resistor 252A for being operable to generate a user-defined amount of heat specific for the first zone and the heating resistors 240B of a second zone 200B being in electrical connection with a second tuning resistor 252B for being operable to generate a user-defined amount of heat specific for the second zone, the first tuning resistor 252A having a resistance different from the resistance of the second tuning resistor 252B.

The arrangement of FIG. 6 differs in that from the arrangement in FIG. 5 in that each heating resistor 240 is provided with a series resistor 240S and a parallel resistor 240P. The series resistor 240S is arranged in series with the heating resistor 240, while the series arrangement of the series resistor 240S and the heating resistor 240 is arranged in parallel with the parallel resistor 240P. With such arrangement, the heat generated by the heating resistor 240 may be adjusted by adjusting the values of the respective series resistor 240S and parallel resistor 240P, as such adjusting may adjust the resistor supply current. In alternative embodiments, the series resistor 240S may be absent, whereby a parallel arrangement of the heating resistor 240 and the parallel resistor 240P is provided. Thus, embodiments may comprise at least one series resistor 240S, each heating resistor 240 being electrically in series with a respective series resistor 240S. The series resistor 240S and respective the heating resistor 240 may thus form a voltage divider among them.

Further or alternative embodiments may comprise at least one parallel resistor 240P, each heating resistor 240 being electrically in parallel with a respective parallel resistor 240P. The parallel resistor 240P and respective the heating resistor 240 may thus divide the current between the two, whereby an improved flexibility in defining the resistor supply current through the heating resistor 240P may be obtained. Further or alternative embodiments may comprise at least one series resistor 240S and at least one parallel resistor 240P, each parallel resistor 240 being electrically in parallel with a series arrangement of a respective heating resistor 250 and a respective series resistor 240S. Each series resistor 240S may be replaceable by another series resistor having a different value or by a zero-ohm shunt resistor. Each parallel resistor 240P may be replaceable by another parallel resistor having a different value or by a jumper providing an open connection.

It will be appreciated that an arrangement with a series resistor 240S and/or a parallel resistor 240P may be also be used when the heating system 300 comprises just a single heating resistor 240. Thus, the conduction heating unit may comprise a series resistor 240S, the series resistor 240S being electrically in series with the heating resistor 240. The conduction heating unit 250 may comprise a parallel resistor 240P, the parallel resistor 240P being electrically in parallel with the heating resistor 240. The conduction heating unit 250 may comprise a series resistor 240S and a parallel resistor 240P, with the parallel resistor 240P being electrically in parallel with a series arrangement of the heating resistor 240 and the series resistor 240S.

Figure 7:
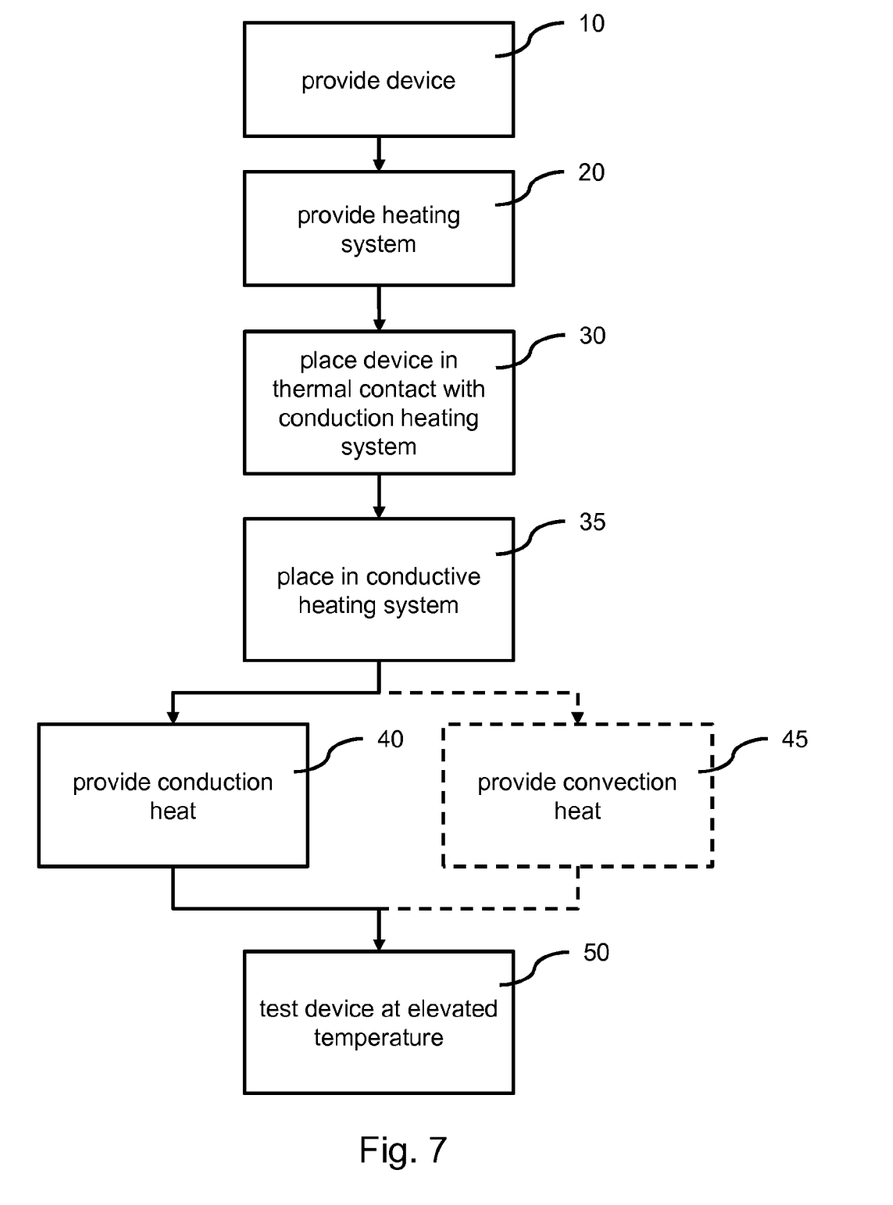
FIG. 7 schematically shows a flow-chart of an example of an embodiment of a HTOL test.

The flow-chart of FIG. 7 schematically illustrates an example of a HTOL test. The HTOL test provides a method of testing a semiconductor device 100 using a heating system 300 according to an embodiment. The method comprises providing 10 a semiconductor device 100 and providing 20 a heating system 300 comprising a conduction heating unit according to an embodiment. The method further comprises placing 30 the semiconductor device 100 in thermal contact with the conduction heating unit 250 as a semiconductor device under test 100. Hereto, the semiconductor device under test 100 may be placed with its exposed pad 102 in contact via the thermal contact area 222 of the heating system 300. The method further comprises operating 40 the heating resistor 240 of the conduction heating unit 250 to provide a part of the heat generated by the heating resistor to the semiconductor device under test 100 via the thermally conductive and electrically insulating connection 220, 242 between the heating resistor 240 and the thermal contact area 222. The method further comprises and operating 50 the semiconductor device under test 100 with electrical operating conditions to conduct a performance test while operating the heating resistor 240 of the conduction heating unit 250 to provide the part of the heat. Hereby, heat may be provided to the semiconductor device under test 100 during its performance test via conduction, whereby the semiconductor device under test 100 may be tested at an elevated temperature during a prolonged period.

In embodiments wherein the heating system 300 further comprises a convection heating chamber 310, heat may further be provided to the semiconductor device under test 100 during its performance test via convection. As indicated with the dashed box 45 in FIG. 7, the method may hereto further comprise operating 45 the convection heating chamber 310 to provide a user-defined heat-controlled convection to the semiconductor device under test 100 while the semiconductor device under test is in thermal contact with the conduction heating unit 250 and the heating resistor 240 of the conduction heating unit is operated 40 to provide the part of the heat generated by the heating resistor 240 to the semiconductor device under test 100 via the thermally conductive and electrically insulating connection 220, 242 between the heating resistor 240 and the thermal contact 222. The semiconductor under test 100 may thus be tested at a temperature above the maximum available temperature of the convection heating chamber 310. E.g., with a convection heating chamber 310 capable of providing a temperature up to a maximum of 135° C., additional heat may be provided from the conduction heating unit 250 to increase the temperature of the semiconductor device under test 100 to obtain a total temperature of e.g. 150° C.

In another embodiment, the method comprises providing 10 a semiconductor device 100A, providing a semiconductor device 100B, providing 20 a heating system 300 comprising a conduction heating unit according to an embodiment, the plurality of heating resistors 240 being arranged in a plurality of zones 200A, 200B. The method further comprises placing 30 the semiconductor device 100A in thermal contact with a first zone 200A of the plurality of zones of the conduction heating unit 250 as a semiconductor device under test 100A and placing the further semiconductor device 100B in thermal contact with a second zone 200B of the plurality of zones as a further semiconductor device under test 100B. The method further comprises operating the plurality of heating resistors 240A in the first zone 200A and the plurality of heating resistors 240B in the second zone 200B to generate a zone-specific user-defined amount of heat. Hereby, a part of the zone-specific user-defined amount of heat generated by the heating resistors of the respective zones 200A, 200B is provided to the respective semiconductor device under test 100A, 100B. The method further comprises and operating 50 the semiconductor device under test 100A and the further semiconductor device 100B with electrical operating conditions to conduct a performance test while operating the heating resistors 240A and 240B of the respective zones 200A, 200B. Hereby, different semiconductor devices different devices may be tested at different temperatures. In further embodiments, the method comprises providing further heat to the semiconductor device under test 100A and the further semiconductor device under test 100B during the performance test via convection using a convection heating chamber 310 as described above.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the device implementing the present invention is, in part, composed of components known to those skilled in the art, details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. E.g., top side 201 may alternatively be referred to as first side 201 and bottom side 202 may alternatively be referred to as second side 202. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method comprising:
   providing a semiconductor device;
   providing a heating system configured to generate heat and bring heat to the semiconductor device, wherein the heating system includes a thermal contact area and a conductive heating unit, the conductive heating unit having a first heating resistor;
   placing the semiconductor device in thermal contact with the thermal contact area of the conduction heating unit as a semiconductor device under test;
   placing the semiconductor device under test into a convection heating chamber;
   operating the first heating resistor of the conduction heating unit to provide a part of the heat generated by the first heating resistor to the semiconductor device under test via a thermally conductive and electrically insulating connection between the first heating resistor and the thermal contact area;
   operating the convection heating chamber to provide a user-defined heat-controlled convection to the semiconductor device under test while the semiconductor device under test is in thermal contact with the conduction heating unit and the first heating resistor of the conduction heating unit is operated to provide the part of the heat generated by the first heating resistor to the semiconductor device under test via the thermally conductive and electrically insulating connection between the first heating resistor and the thermal contact; and
   operating the semiconductor device under test with electrical operating conditions to conduct a performance test while operating the first heating resistor of the conduction heating unit to provide the part of the heat.

2. The method according to claim 1, wherein the first heating resistor is configured to generate a user-defined amount of heat.

3. A method comprising:
   providing a first semiconductor device;
   providing a second semiconductor device;
   providing a heating system configured to generate heat and bring heat to the first and second semiconductor devices, wherein the heating system includes a thermal contact area and a conductive heating unit, the conductive heating unit having a first heating resistor and a second heating resistor;
   placing the first semiconductor device in thermal contact with the thermal contact area of the conduction heating unit as a first semiconductor device under test;
   placing the second semiconductor device in thermal contact with the second heating resistor as a second semiconductor device under test;
   operating the first heating resistor of the conduction heating unit to provide a part of the heat generated by the first heating resistor to the first semiconductor device under test via a thermally conductive and electrically insulating connection between the first heating resistor and the thermal contact area;
   operating the first semiconductor device under test with electrical operating conditions to conduct a performance test while operating the first heating resistor of the conduction heating unit to provide the part of the heat; and
   operating the first heating resistor and the second heating resistor to generate a first user-defined amount of heat at the first heating resistor and a second user-defined amount of heat at the second heating resistor.

4. A heating system for generating heat and bringing heat to a semiconductor device under test, the heating system comprising:
- a conduction heating unit including:
  - a heating resistor; and
  - a two-sided circuit board having a first side and a second side, the heating resistor and an electrical supply line being arranged on the second side, an insulating layer being arranged between the heating resistor and a thermally and electrically conductive connection, the thermally and electrically conductive connection extending through the two-sided circuit board from the supply line on the second side to a thermal contact area provided at the first side;
- the thermal contact area for thermally contacting the semiconductor device under test and for electrically connecting to the semiconductor device under test;
- a thermally conductive and electrically insulating connection between the heating resistor and the thermal contact area, the thermally conductive and electrically insulating connection comprising the thermally and electrically conductive connection between the thermal contact area and the electrical supply line for supplying the semiconductor device under test with a supply voltage; and
- the heating resistor configured to generate a user-defined amount of heat and to provide a part of the heat generated by the heating resistor to the thermal contact area via the thermally conductive and electrically insulating connection.

5. A heating system according to claim 4, further comprising a control system arranged to receive a measure of a temperature at the thermal contact area from an internal thermal sensor in the semiconductor device under test and to control a resistor supply current through the heating resistor in dependence on the measure of the temperature at the thermal contact area.

6. A heating system according to claim 4, the conduction heating unit comprising a plurality of heating resistors arranged in a plurality of zones, the heating resistors in the respective zones configured to generate a zone-specific user-defined amount of heat and to provide a part of the heat generated by the heating resistor the zone to a respective thermal contact area via a respective thermally conductive and electrically insulating connection.

7. A heating system according to claim 6, the heating resistors of a first zone of the plurality of zones being in electrical connection with a first tuning resistor configured to generate a user-defined amount of heat specific for the first zone and the heating resistors of a second zone being in electrical connection with a second tuning resistor configured to generate a user-defined amount of heat specific for the second zone, the first tuning resistor having a resistance different from the resistance of the second tuning resistor.

8. A heating system according to claim 4, further comprising a convection heating chamber operable to provide a user-defined heat-controlled convection to the semiconductor device under test.

9. A heating system according to claim 4, the conduction heating unit further comprising a series resistor, the series resistor being electrically in series with the heating resistor.

10. A heating system according to claim 4, the conduction heating unit further comprising a parallel resistor, with the parallel resistor being electrically in parallel with the heating resistor.

11. A heating system according to claim 4, the heating resistor comprising an open air resistor.

12. A heating system according to claim 4, further comprising a thermally insulating material, such as silicone, shaped to form a thermally insulating cavity at the bottom side of a test board, the heating resistor being arranged inside the thermally insulating cavity.

13. A heating system according to claim 4, the heating resistor being shielded by a protective cover, such as a metal plate.

* * * * *